United States Patent
Jaiswal et al.

(10) Patent No.: US 10,854,291 B2
(45) Date of Patent: Dec. 1, 2020

(54) BACKUP AND/OR RESTORE OF A MEMORY CIRCUIT

(71) Applicant: Arm Limited, Cambridge (GB)

(72) Inventors: Akhilesh Ramlaut Jaiswal, West Lafayette, IN (US); Mudit Bhargava, Austin, TX (US); George McNeil Lattimore, Austin, TX (US)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/167,822

(22) Filed: Oct. 23, 2018

(65) Prior Publication Data

US 2020/0126619 A1    Apr. 23, 2020

(51) Int. Cl.
| G11C 14/00 | (2006.01) |
| G11C 5/06 | (2006.01) |
| G11C 5/14 | (2006.01) |
| G11C 11/419 | (2006.01) |

(52) U.S. Cl.
CPC .......... *G11C 14/0081* (2013.01); *G11C 5/063* (2013.01); *G11C 5/147* (2013.01); *G11C 11/419* (2013.01)

(58) Field of Classification Search
CPC .................................................. G11C 14/0081
USPC ...................................................... 365/185.08
See application file for complete search history.

(56) References Cited

U.S. PATENT DOCUMENTS

| 9,589,636 | B1 | 3/2017 | Bhavnagarwala et al. |
| 2008/0229269 | A1* | 9/2008 | Lamorey ............ G11C 14/0081 716/126 |
| 2011/0280073 | A1* | 11/2011 | Chiu ................... G11C 13/0002 365/185.08 |
| 2012/0320658 | A1* | 12/2012 | Wang .................. G11C 14/0054 365/148 |
| 2013/0135918 | A1* | 5/2013 | Kushida ............. G11C 13/0069 365/145 |

\* cited by examiner

*Primary Examiner* — Hoai V Ho
(74) *Attorney, Agent, or Firm* — Pramudji Law Group PLLC; Ari Pramudji

(57) ABSTRACT

Briefly, embodiments of claimed subject matter relate to backup of parameters, such as binary logic values, stored in nonvolatile memory, such as one or more SRAM cells. Binary logic values from a SRAM cell, for example, may be stored utilizing resistance states of a magnetic random-access memory (MRAM) element. Parameters stored in one or more MRAM elements may be restored to SRAM memory cells following a backup.

6 Claims, 8 Drawing Sheets

BACKUP AND/OR RESTORE OF A MEMORY CIRCUIT

TECHNICAL FIELD

This disclosure relates to backup and/or restore of a memory circuit, such as a circuit utilized in static random-access memory (SRAM).

BACKGROUND

In a computing device, such as a laptop or desktop computer, smart phone, gaming device, etc., a memory device may store instructions for execution by one or more computer processors. Occasionally, such as when the computing device is removed from power during a planned or unplanned power-down operation, parameters stored or loaded into "volatile" memory devices may be lost. At times, loss of such parameters may represent an inconvenience to a user, who must then, for example, restart or reinitialize a computing device so that processing, gaming, or communication operations can begin again.

Although particular types of memories utilized in computing devices, such as flash drives, disk drives, etc., may retain parameters after power-down operations, such "nonvolatile" memories may be unsuitable for many processing operations based, at least in part, on processing delays in accessing and storing parameters. Accordingly, even though nonvolatile memories may be available, certain volatile memory technologies, such as static random-access memory (SRAM) still represent a viable memory technology for use in a wide variety of computing applications. Thus, providing techniques to enhance the utility of SRAM devices, such as developing approaches for the rapid backup of parameters from SRAM devices, into nonvolatile storage, as well as the restoration of parameters from nonvolatile storage back to SRAM, continues to be an active area of investigation.

BRIEF DESCRIPTION OF THE DRAWINGS

The present technique(s) will be described further, by way of example, with reference to embodiments thereof as illustrated in the accompanying drawings. It should be understood, however, that the accompanying drawings illustrate only the various implementations described herein and are not meant to limit the scope of various techniques, methods, systems, circuits or apparatuses described herein.

Figure 1A:
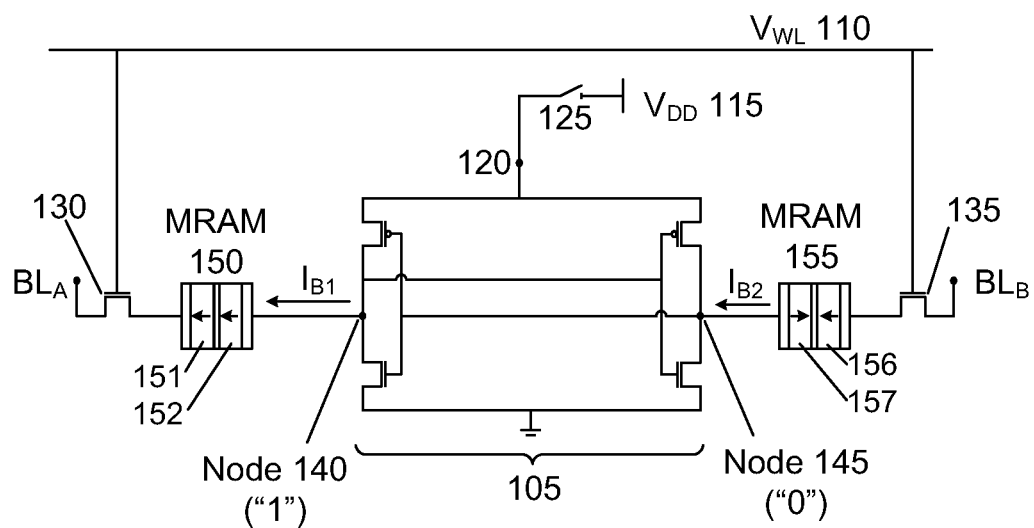
FIG. 1A is a schematic diagram illustrating a circuit for performing a backup operation of binary logic values from a volatile memory into a nonvolatile memory, according to an embodiment.

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

DETAILED DESCRIPTION

As previously discussed, in a computing device, such as a laptop or desktop computer, smart phone, gaming device, or the like, a memory device may store instructions for execution by one or more computer processors. At times, such as when the computing device is removed from power during a planned or unplanned power-down operation, parameters (such as binary logic values) stored or loaded into certain types of computer memory, such as "nonvolatile" memory may be lost. In some instances, loss of binary logic values stored in nonvolatile memories may represent an inconvenience to a user, who must then, for example, restart or reinitialize a computing device so that processing, gaming, or communications operations can resume.

However, although other types of memories utilized in computing devices, such as flash drives, disk drives, etc., may retain binary logic values after power-down operations, such "nonvolatile" memories may be unsuitable for many processing operations based, at least in part, on processing delays in accessing and/or storing binary logic values. Accordingly, even though nonvolatile memories may be available, certain volatile memory technologies, such as static random-access memory (SRAM) still represent a viable memory technology for use in a wide variety of computing applications. Thus, providing techniques to enhance utility of SRAM devices, such as developing approaches for the rapid backup of binary logic values from SRAM devices, into nonvolatile storage, as well as the restoration of binary logic values from nonvolatile storage back to SRAM, continues to be an active area of investigation.

In particular embodiments, a computer memory cell, such as a six-transistor SRAM cell, may operate to store a binary logic value, which may be accessed at a first output node. A six-transistor SRAM cell may additionally operate to store a complement of a binary logic value, which may be accessed at a second output node. A backup memory element, such as one or more magnetic tunneling junction (MTJ) elements, or other type of magnetic random-access memory device (MRAM), for example, may be positioned nearby a SRAM cell. In certain embodiments, one or more SRAM cells may be formed during a device fabrication stage, such as at the front-end-of-line (FEOL) of a wafer fabrication process, and one or more MRAM elements may be fabricated at the back-end-of-line (BEOL) of a wafer fabrication process. Accordingly, responsive to such positioning of backup memory elements with respect to SRAM cells, backup operations from individual SRAM cells for storage into individual nonvolatile MRAM elements may be performed in time periods ranging from, for example, about 5.0 ns to about 50.0 ns, for example. Additionally, responsive to positioning of nonvolatile MRAM elements, so as to permit direct accessibility of MRAM elements by SRAM cells, entire arrays of SRAM cells to be backed up by MRAM elements within very short time periods.

In particular embodiments binary logic values stored in nonvolatile memory elements, such as MRAM elements, may be utilized to restore binary logic values previously stored in volatile memory elements, such as SRAM cells. In addition, responsive to location of MRAM elements nearby to SRAM cells, such as on the same semiconductor wafer, restoration of entire arrays, for example, of SRAM cells may be performed quickly and with reduced processing overhead. Further, at least in certain embodiments, MRAM elements may be placed in parallel with one another, so as to permit backup and restoration of two or more binary logic values, which may be accessed from a SRAM cell at different times. For example, in one embodiment, a first group of MRAM elements may be utilized to perform a backup operation of an array of SRAM cells and a first time, such as following execution of a first set of computer instructions, and a second group of MRAM elements may be utilized to perform a backup operation of an array of SRAM cells at a second time, such as following execution of a second set of computer instructions. Restoration of an array of SRAM cells may be initiated based, at least in part, on a selection between times at which first and second backup operations were performed.

In particular embodiments, it may be possible for system designers, for example, to perform trade-offs, which may permit flexibility and optimization among backup and restore operations. For example, in certain embodiments, a trade-off may be made between electric current utilization and a time span available for performing backup operations, wherein larger electric currents may bring about more rapid and/or reliable backup and/or restore operations. Additional flexibility in circuit designs may be possible, such as use of SRAM transistor cells comprising 6 transistors, 8 transistors, 10 transistors, and so forth, as well as use of increased or "boosted" voltages applied to SRAM cells to bring about enhanced stability of binary logic values, accessible at first and second output nodes of a SRAM cell, and claimed subject matter is intended to embrace all such variations.

Before discussing embodiments in reference to the accompanying figures, a brief description of various non-limiting embodiments is provided. For example, one embodiment may comprise applying a SRAM cell supply voltage to a SRAM cell. The method may further comprise applying a voltage level equal to a fraction of a SRAM cell supply voltage, to a first bit-line coupled to a first input node of the SRAM cell. The applied voltage may equal approximately one half of the SRAM cell supply voltage. A similar voltage may additionally be applied to a second bit-line coupled to a second input node of the SRAM cell. Applying the fraction (e.g., one half) of the SRAM cell supply voltage to the first bit-line may bring about storing, such as in a first nonvolatile memory element coupled to the first input node of the SRAM cell, a first binary logic value from the SRAM cell. Likewise, applying the fraction (e.g., one half) of the SRAM cell supply voltage to the second bit-line may bring about storage of a complement of the first binary logic value.

Another embodiment may comprise a circuit to perform a backup of a SRAM cell, in which the SRAM cell comprises a plurality of transistors arranged as a cross-coupled inverter pair. Thus, in one particular embodiment, the SRAM cell may comprise a six-transistor circuit comprising two access transistors, for example, as well as four additional transistors, which may operate to store one or more binary logic values while power is applied to the six-transistor circuit. The first access transistor may be coupled to a first node of the cross-coupled inverter pair via a first MRAM element. A second access transistor may be coupled to a second node of the cross-coupled inverter pair via a second MRAM element.

Another embodiment may comprise a method of backing up and restoring binary logic values, to a SRAM cell. The method may comprise applying a voltage equal to a fraction (e.g., one half) of a normal operating value of a SRAM cell supply voltage to a first bit-line coupled to a first input node of the SRAM cell. The first bit-line may be coupled to a first input node of the SRAM cell. The method may further include, responsive to the applying of the first bit-line of the SRAM cell to the fraction of the normal operating value of the SRAM cell supply voltage, conducting a first electric current through a first MRAM element, wherein a direction of the first electric current may be based, at least in part, on a binary logic value accessed at the first input node of the SRAM cell. To perform a restoring operation, method may comprise applying an appropriate word-line voltage and SRAM cell supply voltage while applying reference voltage to the first bit-line and to the second bit-line. However, in other embodiments, a restoring operation may involve applying a voltage other than a reference voltage, such as a voltage that comprises a value equal to less than about 25.0% of a normal operating value of the SRAM cell supply voltage.

Particular embodiments will now be described with reference to the figures, such as FIG. 1A, which comprises a schematic diagram illustrating a circuit for performing a backup operation of binary logic values from a volatile memory to a nonvolatile memory, in accordance with various embodiments described herein. In FIG. 1A, closure of switch 125 may operate to provide a normal operating value of SRAM cell supply voltage 115 ($V_{DD}$) to the cross-coupled inverter pair of SRAM cell 105. In this context, a normal operating value of a SRAM cell supply voltage is defined as a voltage sufficient to carry out operations related to reading logic values from the SRAM cell, and/or to carry out operations related to writing logic values to the SRAM cell, during typical computing operations of an associated processor.

Word-line voltage 110 ($V_{WL}$ 110 in FIG. 1A) may be arranged to provide a voltage signal to one or more SRAM cells, such as SRAM cell 105. In certain embodiments, word-line voltage 110 may be utilized to provide an electric current to an array of access transistors, such as access transistors 130 and 135 of SRAM cell 105 as well as to an array of additional SRAM cells, which may comprise a plurality of cells similar to SRAM cell 105. Thus, additional access transistors, as well as additional SRAM cells, may be arranged to store and/or access one or more binary digital words comprising 8 binary digits, 16 binary digits, 32 binary digits, 64 binary digits, or any other number of binary digits, and claimed subject matter is not limited in this respect. In FIG. 1A, SRAM cell 105, which comprises access transistors 130 and 135 as well as a cross-coupled inverter pair comprising two PMOS and two NMOS transistors, may be fabricated utilizing any suitable fabrication technology to form complementary metal oxide semiconductor (CMOS) transistors. It should be noted that claimed subject matter is intended to embrace any fabrication technology.

SRAM cell 105 may be capable of providing, for example, a binary logic value, such as a binary "1" and its complement, such as a binary "0," at nodes 140 and 145. In the circuit of FIG. 1A, when switch 125, which operates to couple SRAM cell supply voltage ($V_{DD}$ 115) to SRAM cell 105, is placed in a closed position, a binary logic value of "1," which may be represented via a presence of a relatively high voltage, may be accessed at node 140. Closure of switch 125 may additionally operate to provide a binary logic value of "0" at node 145. In particular embodiments, node 140 of SRAM cell 105 may represent a first node of the SRAM cell, which may be accessed via application of a voltage at the gate of access transistor 130. Similarly, node 145 of SRAM cell 105 may represent a second node of the SRAM cell, which may be accessed via application of a voltage at the gate of access transistor 135. It should be noted, however, that designation of a binary logic value of "1" at node 140 and designation of a binary logic value of "0" at node 145 represent an arbitrary designation of binary logic values at first and second nodes of a SRAM cell, and claimed subject matter is not limited in this respect.

MRAM element 150 and MRAM element 155 may each comprise one or more magnetic tunneling junctions, which may operate as a two-state device capable of storing a binary logic value of "1" or a binary logic value of "0." In a particular embodiment, MRAM elements 150 and 155 may comprise a low-resistance state based, at least in part, on a direction of a magnetization vector of a first localized region of the MRAM element relative to a second localized region of the MRAM element. The direction of the magnetization vector in the ferromagnets may be either substantially in the plane of the ferromagnetic layers or may be substantially perpendicular to the plane of the ferromagnetic layers. For example, MRAM element 150, which may comprise localized ferromagnetic regions 151 and 152, may exhibit a relatively low resistance when orientation of the magnetization vector of localized ferromagnetic regions 151 and 152 are in a direction that are at least similar (e.g., parallel) to each other and perpendicular to the plane of the ferromagnetic layers of the MRAM element (e.g. ←‖← as shown in FIG. 1A). Conversely, MRAM element 150 may exhibit a relatively high resistance when orientation of the magnetization vector of localized ferromagnetic regions 151 and 152 are oriented in directions that are generally opposed to one another (e.g., antiparallel) and perpendicular the plane of the ferromagnetic layers of the MRAM element (e.g., →‖← as shown in FIG. 1A). It should be noted that in another embodiment (not shown in FIG. 1A) localized ferromagnetic regions may be oriented in directions that are parallel/antiparallel with each other but oriented in directions along the plane (e.g., ↑‖↑ or ↑‖↓) of each of the localized ferromagnetic regions.

In operation, responsive to an electric current of sufficient magnitude conducting through localized ferromagnetic regions 151 and 152 of MRAM element 150, the magnetization vector of the localized region may be oriented, for example, in the direction of the plane of the ferromagnetic layers of the MRAM element. Additionally, at least in particular embodiments, when conduction of an electric current is interrupted, the magnetization vector of localized ferromagnetic regions 151 and 152 may retain such an orientation. In a subsequent operation, application of a "sense" voltage to MRAM element 150 may permit detection of the magnetization vector of localized ferromagnetic regions 151 and 152 via determining conduction of at least a threshold current through MRAM element 150. In certain embodiments, conduction of an electric current greater than a threshold amount may give rise to detection of a binary logic value of "1," while conduction of an electric current less than a threshold amount may give rise to detection of a binary logic value of "0." In a nonlimiting example, MRAM element 150 may comprise an "on" state resistance, which may indicate presence of a binary logic value of "1," when application of a sense voltage indicates a resistance of between, for example, 3.0 kΩ and about 10.0 kΩ. In another nonlimiting example, MRAM element 150 may comprise an "off" state resistance, which may indicate a presence of a binary logic value of "0," when application of a sense voltage indicates a resistance of between, for example, about 9.0 kΩ and about 30.0 kΩ. It should be noted, however, that designations of binary logic values as being indicative of particular resistance states (e.g., "on" and "off") is arbitrary, and claimed subject matter is not limited in this respect.

Operation of the circuit of FIG. 1A may be initiated by first storing or writing a binary logic value of "1" to the cross-coupled inverter pair of SRAM cell 105, which may be accessed at node 140, wherein node 140 may comprise a first output node of the cross coupled inverter pair of SRAM cell 105. Responsive to the operation of the cross-coupled inverter of SRAM cell 105, a binary logic value of "0," which may comprise the binary logic complement of "1," may be accessed at node 145, wherein node 145 may comprise a second output node of the cross coupled inverter pair of SRAM cell 105. In the circuit of FIG. 1A, a binary logic value of "1" may comprise a voltage substantially equal to SRAM cell supply voltage 115 ($V_{DD}$), while a binary logic value of "0" may comprise a voltage substantially equal to a reference potential, such as a local ground.

In the circuit of FIG. 1A, initiating a backup of the binary logic values accessible at nodes 140 and 145 of SRAM cell 105 to MRAM elements 150 and 155, respectively, may begin by closing switch 125, which may couple supply voltage ($V_{DD}$ 115) to node 120. Backup may continue with activation of word-line voltage 110 ($V_{WL}$ 110 in FIG. 1A), which may operate to enable conduction of an electric current through access transistors 130 and 135. Following, or concurrent with, application of a word-line voltage to access transistors 130 and 135, a voltage equal to a fraction, such as one half, of the value of a normal operating value of SRAM cell supply voltage 115 ($V_{DD}$) may be applied to bit-line A ($BL_A$ in FIG. 1A) and to bit-line B ($BL_B$ in FIG.

1A). In other embodiments, however, a voltage applied to bit-line A and to bit-line B may comprise a value other than one half of voltage 115, such as a value between about 25.0% voltage 115 and about 75.0% of voltage 115, and claimed subject matter is not limited in this respect.

In the circuit of FIG. 1A, application of one-half of the normal operating value of SRAM cell supply voltage 115 may bring about conduction of an electric current from node 140 in the direction of MRAM element 150. Such conduction may occur responsive to a binary logic value of "1" comprising a voltage that is substantially equal, for example, to the normal operating value of SRAM cell supply voltage ($V_{DD}$ 115), which may give rise to current conduction in the direction of bit-line A. In the circuit of FIG. 1A, when current conducted through MRAM element 150 ($I_{B1}$ in FIG. 1A) comprises a sufficient magnitude, a magnetization vector of localized ferromagnetic regions 151 and 152 may switch orientation, so as to be oriented in a direction that is at least similar (e.g., parallel) to the other. Accordingly, if a voltage is subsequently removed from the cross coupled inverter pair of SRAM cell 105, as well as from access transistor 130, MRAM element 150 may retain a binary logic value of "1" via the orientation of the magnetization vectors relative to each other.

In FIG. 1A, application of one-half of the normal operating value of SRAM cell supply voltage ($V_{DD}$ 115) may additionally bring about conduction of an electric current from bit-line B ($BL_B$ in FIG. 1A) in the direction of MRAM element 155. Such conducting may occur responsive to a binary logic value of "0" comprising a voltage that is substantially equal, for example, to a reference potential, such as a local ground. When current conducted through MRAM element 155 ($I_{B2}$ in FIG. 1A) comprises a sufficient magnitude, the magnetization vector of localized ferromagnetic regions 156 and 157 may switch orientation, so as to be oriented in a direction that is generally parallel to each other or antiparallel to each other. Accordingly, if the voltage is subsequently removed from SRAM cell 105, as well as from access transistor 130, MRAM element 150 may retain a binary logic value of "0" via the orientation of the magnetization vector of localized ferromagnetic regions 156 and 157.

Figure 11:
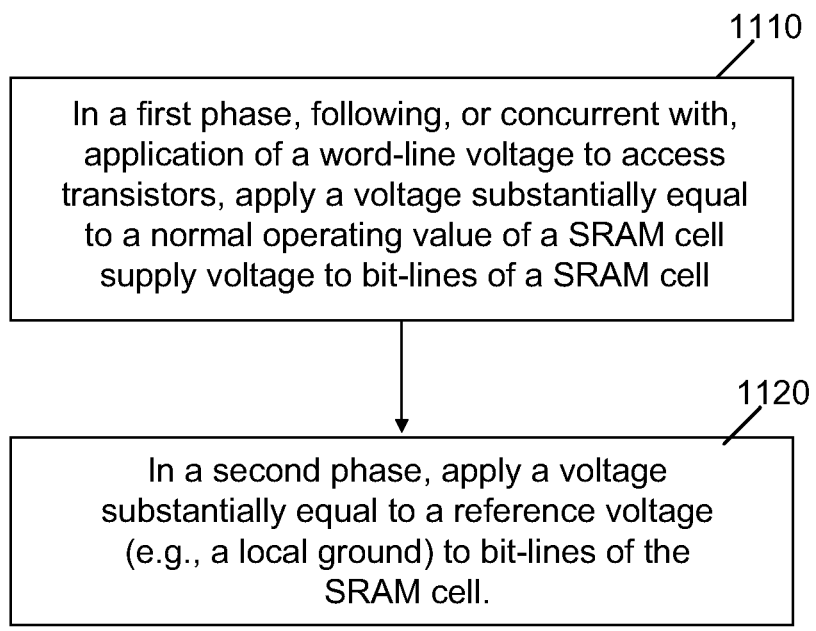
FIG. 11 is a flow chart for a method for performing a two-phase backup operation of a SRAM cell, according to an embodiment.

In an embodiment related to embodiment 100, utilizing the process discussed with respect to FIG. 11, binary logic values from SRAM cell 105 may be stored within MRAM elements 150 and 155 in a manner that may offer one or more advantages over the previously-described approach. In one embodiment, following, or concurrent with, application of a word-line voltage to access transistors 130 and 135, a voltage substantially equal to the normal operating value of SRAM cell supply voltage 115 ($V_{DD}$) may be applied to bit-line A ($BL_A$) and to bit-line B ($BL_B$). Application of a voltage substantially equal to the normal operating value of SRAM cell supply voltage 115 to bit-line B ($BL_B$), such as in a first phase of a two-phase backup operation, may bring about conduction of an electric current from bit-line B ($BL_B$) in the direction of MRAM element 155. Such conduction may occur responsive to a binary logic value of "0" comprising a voltage that is substantially equal, for example, to a reference potential, such as a local ground. When current conducted through MRAM element 155 ($I_{B2}$) comprises a sufficient magnitude, a magnetization vector of localized ferromagnetic regions 156 and 157 may switch orientation, so as to be oriented in a direction that is generally antiparallel to each other. Accordingly, if the voltage is subsequently removed from SRAM cell 105, as well as from access transistor 135, MRAM element 155 may retain a binary logic value of "0" via the orientation of the magnetization vector of localized ferromagnetic regions 156 and 157.

However, it may be appreciated that responsive to a voltage equal to the normal operating value of SRAM cell supply voltage 115 ($V_{DD}$) being applied to bit-line A ($BL_A$), a significant current may be unlikely to be conducted from SRAM cell 105 in the direction of MRAM element 155 (e.g., $I_{B1} \approx 0.0$). Hence, responsive to a negligible or an insufficient current being conducted from SRAM cell 105 and through MRAM element 150, the magnetization vectors of localized ferromagnetic regions 151 and 152 may be unlikely to switch orientation. Accordingly, in a second phase of a two-phase backup operation, a voltage equal to a reference voltage, such as a local ground, may be applied to bit-line A ($BL_A$) and to bit-line B ($BL_B$). Application of a reference voltage to bit-line A ($BL_A$), may bring about conduction of electric current from SRAM cell 105 in the direction of MRAM element 150. Such conduction may occur responsive to a binary logic value of "1" comprising a voltage that is substantially equal to a normal operating value of SRAM cell supply voltage 115 ($V_{DD}$). When current conducted through MRAM element 150 ($I_{B1}$) comprises sufficient magnitude, the magnetization vector of localized ferromagnetic regions 151/152 may switch orientation, so as to be oriented in a direction that is parallel to each other. Accordingly, if the voltage is subsequently removed from SRAM cell 105, as well as from access transistor 130, MRAM element 155 may retain a binary logic value of "1" via the orientation of the magnetization vector of localized ferromagnetic regions 151 and 152.

In another embodiment the above-discussed two-phased operation may occur in a reverse order, such as beginning with application of a voltage equal to a reference voltage to bit-line A ($BL_A$) and to bit-line B ($BL_B$) followed by application of a voltage substantially equal to the normal operating value of SRAM cell supply voltage 115 to bit-line B ($BL_B$). It may be appreciated that the above-discussed two-phase operations may consume additional time over and above one or more previously described approaches. In an embodiment, the above-discussed two-phase operations may consume twice the duration the approach described with reference to FIG. 1A. However, in particular embodiments, such increased time, in combination with greater voltages across MRAM elements 150 and 155, may bring about greater current conduction through MRAM elements 150 and 155. In an embodiment, increased time and applied voltage may provide an increased likelihood that binary logic values may be written into, for example, MRAM elements 150 and 155.

Figure 1B:
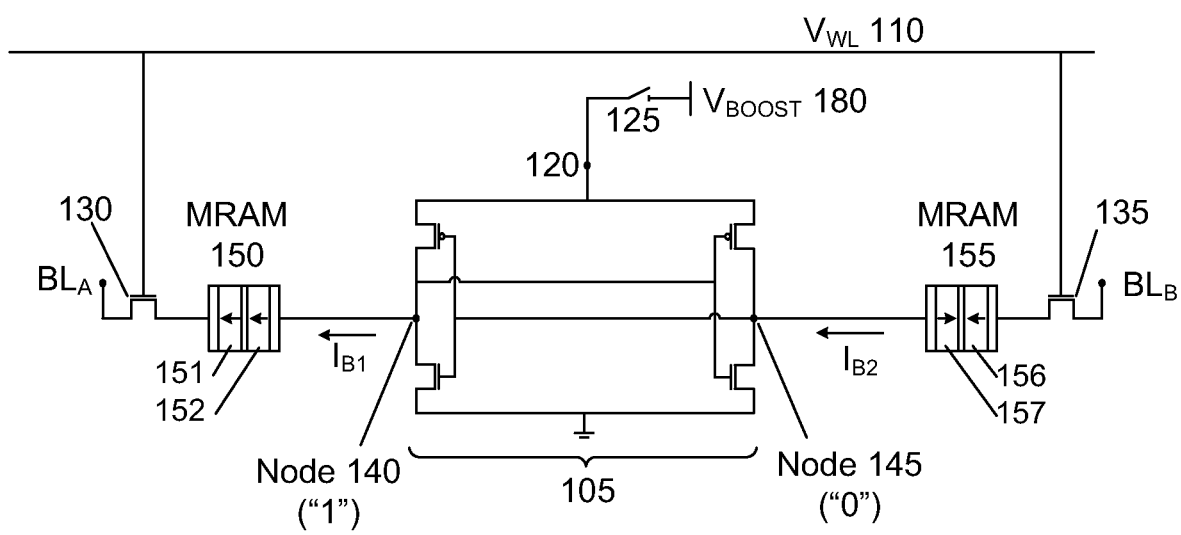
FIG. 1B, is a schematic diagram illustrating another circuit for performing a backup operation of binary logic values, from a volatile memory into a nonvolatile memory, according to an embodiment.

FIG. 1B is a schematic diagram 175 illustrating another circuit for performing a backup operation of binary logic values from a volatile memory into a nonvolatile memory, according to an embodiment. In FIG. 1B, similar to that of FIG. 1A, prior to initiating backup of, for example, a binary logic value of "1" at node 140 utilizing MRAM element 150, boost voltage signal 180 ($V_{BOOST}$ 180) may be applied at node 120 of SRAM cell 105. In the circuit of FIG. 1B, application of boost voltage signal 180 to node 120 may operate to stabilize binary logic values accessible at nodes 140 and nodes 145 via access transistors 130 and 135 of SRAM cell 105. Accordingly, responsive to a presence of boost voltage signal 180, current conduction through MRAM element 150 ($I_{B1}$) may be unlikely to inadvertently transition binary logic values accessible at nodes 140 and 145, for example, from a value of "1" to a value of "0." In particular embodiments, a value of boost voltage signal 180 may exceed the normal operating value of SRAM cell supply voltage 115 ($V_{DD}$) by an amount of between about 20.0% and about 50.0% of a nominal voltage level. Accordingly, when SRAM cell supply voltage 115 ($V_{DD}$) comprises a normal operating value of, for example, 1.0 V, boost voltage signal 180 may be limited, so as not to exceed 1.5 V. However, in other embodiments, boost voltage signal 180 may be permitted to exceed 50.0% of a normal operating voltage, such as by attaining a value of about 1.6 V (60.0%), 1.8 V (80.0%), etc., and claimed subject matter is intended to embrace all values of a boost voltage applied to the cross coupled inverter pair of SRAM cell 105.

Thus, by way of applying a combination of voltage signals (e.g., reference voltages, voltages equal to a fraction of a normal operating value of SRAM cell supply voltage, and voltages approximately equal to a normal operating value of SRAM cell supply voltage) to one or more bit-lines of a SRAM cell (e.g., $BL_A$ and/or $BL_B$ in FIG. 1A and FIG. 1B) binary logic values accessible at output nodes of the SRAM cell (e.g., node 140 and/or node 145) may be written to or stored within MRAM elements (e.g., MRAM elements 150 and 155). Further, in one embodiment, application of a boost voltage signal (e.g., $V_{BOOST}$ 180 of FIG. 1B) may be applied, which may operate to stabilize binary logic values accessible at output nodes of the SRAM cell (e.g., node 140 and/or node 145). A boost voltage signal may reduce likelihood of the inadvertent transition from, for example, a binary logic value of "1" to a binary logic value of "0," which may occur responsive to current conducted through MRAM elements.

Figure 2:
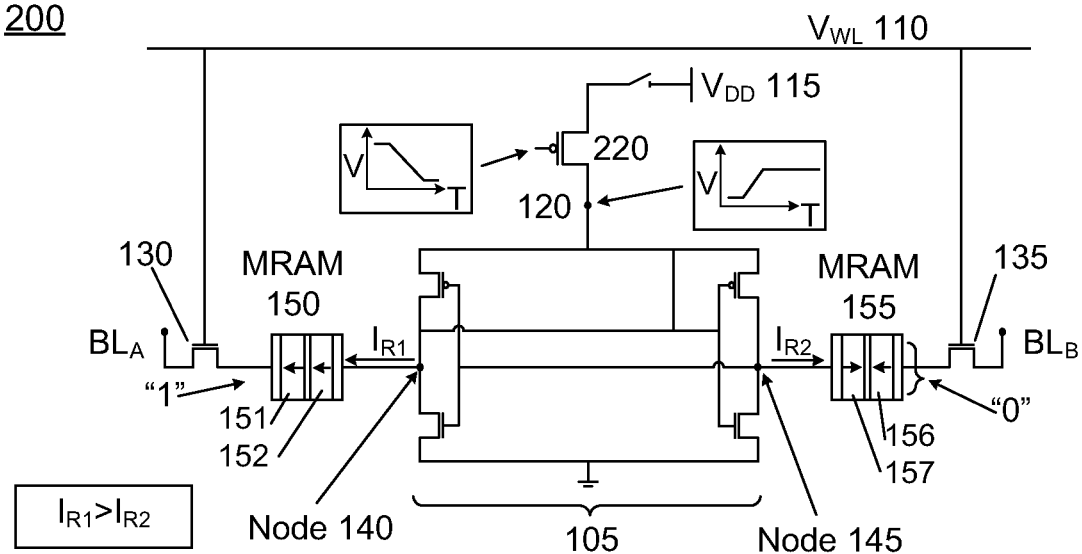
FIG. 2 is a schematic diagram illustrating a circuit for restoring binary logic values from a nonvolatile memory into a volatile memory, according to an embodiment.

FIG. 2 is a schematic diagram illustrating a circuit 200 for restoring binary logic values from a nonvolatile memory into a volatile memory, according to an embodiment. As shown in FIG. 2, embodiment 200 comprises a number of components similar or identical to those of FIGS. 1A-1B, such as word-line voltage 110, SRAM cell supply voltage 115, SRAM cell 105, MRAM elements 150 and 155, access transistors 130 and 135. In the circuit of FIG. 2, P-type power switching MOSFET 220, which may represent an implementation of switch 125 shown and described with reference to FIGS. 1A-1B, is shown as coupled between SRAM cell supply voltage 115 ($V_{DD}$) and node 120 of SRAM cell 105. In the circuit of FIG. 2, switching MOSFET 220 may perform a power management function, which may enable SRAM cell 105 to be selectively coupled and decoupled from SRAM cell supply voltage 115. Power switching MOSFET 220 may perform additional power management functions, and claimed subject matter is not limited in this respect.

In the circuit of FIG. 2, following storage of a binary logic value of "1" by MRAM element 150 and storage of a binary logic value of "0" by MRAM element 155, stored binary logic values may be restored to SRAM cell 105. As discussed in relation to FIG. 1A, MRAM element 150 comprises a nonvolatile storage element, which may comprise an "on" state resistance to indicate storage of a binary logic value of "1." Also, as discussed in relation to FIG. 1A, in an "on" state, MRAM element 150 may comprise a resistance of, for example, between about 3.0 kΩ and about 10.0 kΩ, although claimed subject matter is not limited to any particular range of "on" state resistance. With respect to MRAM element 155, which may comprise an "off" state resistance to indicate a binary logic value of "0," MRAM element 155 may comprise a resistance of, for example, between about 9.0 kΩ and about 30.0 kΩ, although claimed subject matter is not limited to any particular range of "off" state resistances. In the circuit of FIG. 2, following restoration of stored binary logic values may bring about a logic value of "1" being available at node 140, and a logic value of "0" being available at node 145. Additionally, the logic values of "1" at node 140 and a logic value of "2" at node 145 may be maintained by SRAM cell 105 via operation of the cross-coupled inverters of SRAM cell 105.

A restoration operation may be initiated by applying a reference voltage, such as a voltage at least approximately equal to a local ground, for example, to bit-line A ($BL_A$) and to bit-line B ($BL_A \approx 0.0$ and $BL_B \approx 0.0$) of FIG. 2. Following application of a reference voltage to bit-line A and to bit-line B, word-line voltage 110 may be increased from a reference potential to a value that may approach an operating value of SRAM cell supply voltage 115. It may be appreciated that an increase in word-line voltage 110 from, for example, a reference potential may bring about a capability for conduction of an electric current through access transistors 130 and 135. In turn, a voltage signal applied to the gate of power switching (P-type) MOSFET 220 may be decreased from a relatively high voltage to a relatively low voltage, which may thereby allow an electric current to conduct through MOSFET 220. Accordingly, in response to an increasing voltage at node 120 of SRAM cell 105, and responsive to access transistor 130 operating in a conductive state, an electric current ($I_{R1}$) may be permitted to conduct from node 140 through MRAM element 150. Similarly, and also in response to an increasing voltage at node 120, and responsive to access transistor 135 operating in a conductive state, an electric current ($I_{R2}$) may be permitted to conductive from node 145 through MRAM element 155.

In the circuit of FIG. 2, responsive to MRAM element 150 operating in a low-resistance state (e.g., an "on" state) and responsive to MRAM element 155 operating in a high-resistance state (e.g., an "off" state) current conducted through MRAM element 150 may exceed current conducted through MRAM element 155 as indicated via $I_{R1} > I_{R2}$ in FIG. 2. Accordingly, over a duration, which may comprise between about 5.0 ns and about 50.0 ns, for example, a relatively large number of electrical charges may accumulate at node 140 prior to conduction of the electrical charges through MRAM element 150 and to bit-line A ($B_{LA}$). Likewise, over a duration, which may comprise between about 5.0 ns and about 50.0 ns, for example, a relatively small number of electrical charges may accumulate at node 145 prior to conduction of the electrical charges through MRAM 155 and to bit-line ($B_{LB}$). Responsive to accumulation at node 140 of a smaller number of electrical charges than at node 145, a potential of node 145 may rapidly increase to a level commensurate with a binary logic value "1." As a consequence, the cross coupled inverter pair of SRAM cell 105 may attain a logic state in which a binary logic value of "0" may be accessed at node 140, and a binary logic value of "1" may be accessed at node 145.

Figure 3:
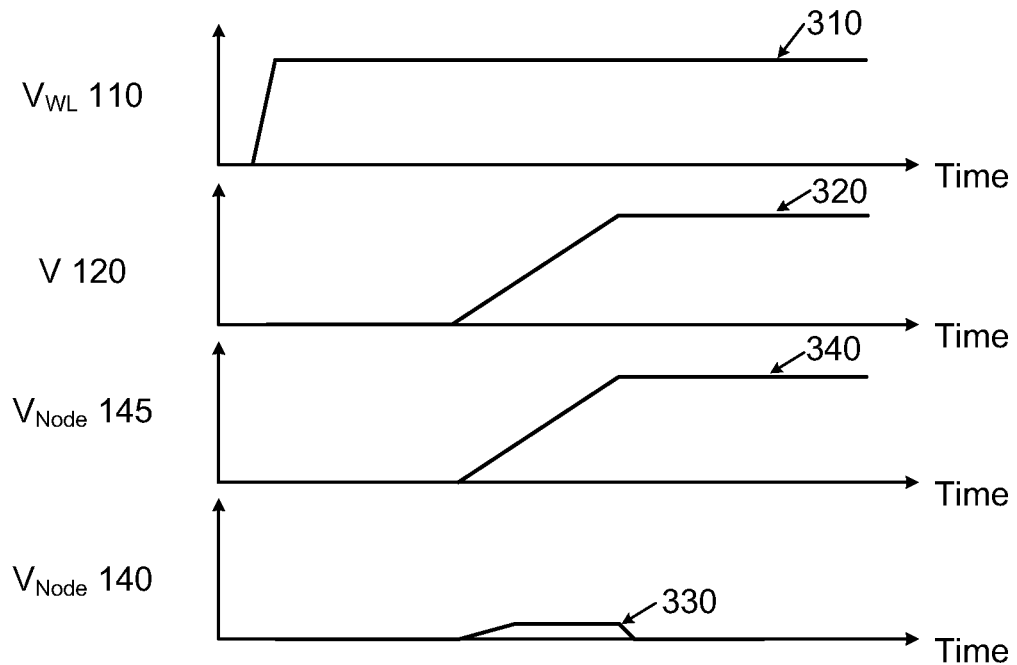
FIG. 3 is a diagram illustrating profiles of voltage signals at various points of the circuit of FIG. 2 plotted against a common timescale during a restoration operation, according to an embodiment.

FIG. 3 is a diagram 300 illustrating profiles of voltage waveforms at various points of the circuit of FIG. 2 plotted against a common timescale during a restoration operation, according to an embodiment. It should be noted that the voltage waveforms of FIG. 3 correspond to simulated results based on particular circuit characteristics and/or fabrication parameters, and claimed subject matter is not limited to waveforms that match those of set forth in FIG. 3. Additionally, the timescale shown in FIG. 3 is intended to merely illustrate an example timescale. Further, although not shown in the circuit of FIG. 3, a reference potential, such as a local ground, may be applied to bit-lines A and B ($B_{LA}$ and $B_{LB}$) prior to increasing a word-line voltage 110 ($V_{WL}$ 110), a voltage at node 120 (V 120), a voltage at node 140 ($V_{NODE}$ 140), and a voltage at node 145 ($V_{NODE}$ 145).

Following application of the reference potential to bit-lines A and B, a restoration operation may proceed with elevation of a word-line voltage ($V_{WL}$ 110) from a reference value, as shown in waveform 310. In particular embodiments, a word-line voltage may be elevated to a level that may place access transistors (e.g., access transistors 130 and 135 of FIG. 2) into a conductive state. After the word-line voltage ($V_{WL}$ 110) attains a predetermined level, such as 1.0 V, 1.2 V, 1.5 V, an application of a voltage to a gate of a power switching transistor (e.g., MOSFET 220 of FIG. 2) may permit node 120 ($V_{120}$) to attain a normal operating value of SRAM cell supply voltage, as shown by waveform 320. In particular embodiments, node 120 may attain a voltage that is at least similar to a normal operating value of SRAM cell supply voltage 115.

Responsive to a voltage at node 120, which may be at least comparable to a normal operating value of SRAM cell supply voltage, an electric current may be conducted through a first resistive memory element, such as MRAM element 150 of FIG. 2. Accordingly, a voltage at node 145 ($V_{NODE\ 145}$) may increase, as indicated by waveform 330. Similarly, and also responsive to a voltage at node 120, an electric current may be conducted through a second resistive memory element, such as MRAM element 155 of FIG. 2. However, based, at least in part, on increased electric current through MRAM element 150 relative to MRAM element 155, node 140 may attain a voltage ($V_{NODE\ 140}$) that is lower, for example, than a voltage attained at node 145 ($V_{NODE\ 145}$). In addition, responsive to a SRAM cell, such as SRAM cell 105 of FIG. 2, retaining a binary logic value of "0" at node 140, the SRAM cell may retain a binary logic value complementary to "0" at node 145. Accordingly, as shown in FIG. 3, as waveform 330 attains a maximum value, waveform 340, which corresponds to a voltage at node 140 of the SRAM cell, attains only a brief and modest increase from a reference value before being pulled or drawn to a much lower level, such as the level of the voltage reference.

Figure 4:
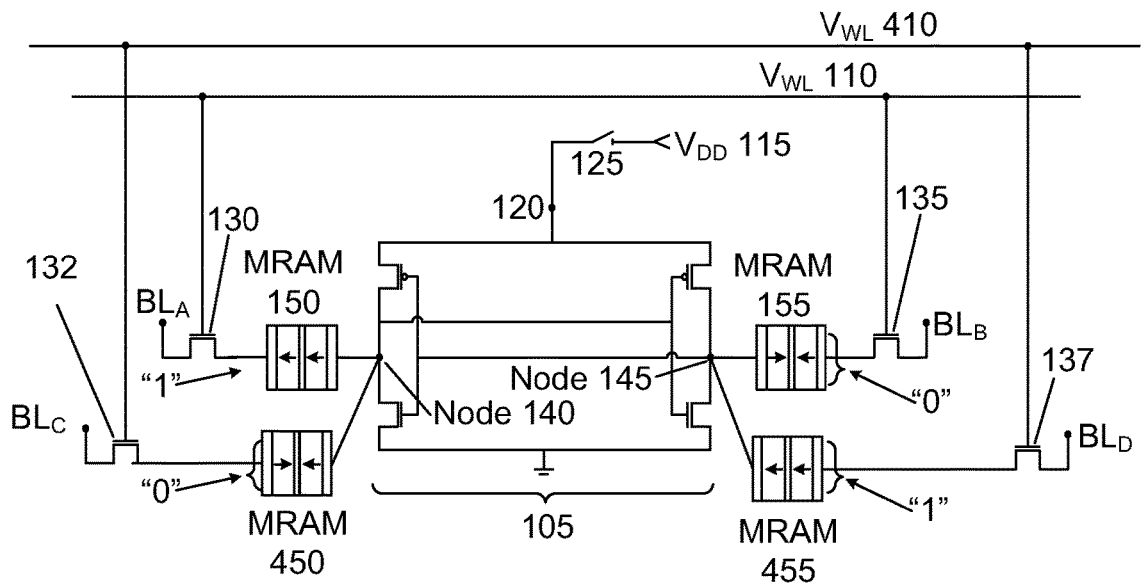
FIG. 4 is a schematic diagram illustrating a circuit for performing backup and restore operations of a plurality of binary logic values from a volatile memory into nonvolatile memory, according to an embodiment.

FIG. 4 is a schematic diagram illustrating a circuit 400 for performing backup and restore operations of a plurality of binary logic values from a volatile memory and into non-volatile memory, according to an embodiment. As shown in the circuit of FIG. 4, a SRAM cell, such as SRAM cell 105, may obtain an operating voltage from SRAM cell supply voltage 115 under the control of a switch, such as switch 125. By way of closure of switch 125, a SRAM cell supply voltage may be present at node 120, which may permit SRAM cell 105 to retain binary logic values at nodes 140 and 145. Additionally, by way of application of a voltage to $BL_A$ and $BL_B$, such as a voltage equal to a fraction of a normal operating value of SRAM cell supply voltage, an electric current may conduct through a first group of MRAM elements, such as a group comprising MRAM element 150 and MRAM element 155. A conducted electric current may place MRAM elements of a first group of MRAM elements into a relatively high-resistance state, such as a state comprising a resistance of between about 9.0 kΩ and about 30.0 kΩ, or a relatively low-resistance state, such as a state comprising a resistance of between about 3.0 kΩ and about 10.0 kΩ. Following an operation to store binary logic values in a first group of MRAM elements, a reference voltage may be applied to $BL_A$ and $BL_B$ while a normal operating value of SRAM cell supply voltage is applied to node 120, which may permit storage of binary logic values from a first group of MRAM elements to be stored within SRAM cell 105.

In one embodiment, in addition to a first group of MRAM elements (e.g., comprising elements 150 and 155) being coupled to the SRAM cell 105, a second group of MRAM elements, such as a group comprising elements 450 and 455, may be coupled in parallel with the first group of MRAM elements. Such an arrangement of a first group of MRAM elements in parallel with a second group of MRAM elements may be utilized to perform a first backup operation of a SRAM cell storing a first binary logic value, which may follow execution of a first set of computer instructions, as well as a second backup operation of a SRAM cell comprising a second binary logic value, which may follow execution of a second set of computer instructions. For example, as indicated in FIG. 4, responsive to a first backup operation, a binary logic value of "1" may be stored in MRAM element 150 while a binary logic value of "0" may be stored in MRAM element 155. Additionally, responsive to a second backup operation of SRAM cell 105, a binary logic value of "0" may be stored within MRAM element 450 while a binary logic value of "1" may be stored within MRAM element 455.

In the circuit of FIG. 4, a restoring operation may be selectable based, at least in part, on application of a reference voltage (e.g., a local ground) to $BL_A$ and $BL_B$, which may allow binary logic values from MRAM elements 150 and 155 to be written into at nodes 140 and 145, respectively, of SRAM cell 105. Additionally, application of a reference voltage to bit-line C and bit-line D ($BL_C$ and $BL_D$ in FIG. 4) may allow binary logic values from MRAM elements 450 and 455 to be written into at node 140 and 145, respectively. It should be noted that although FIG. 4 shows access transistors 130 and 135 being placed into a current-conducting state by way of application of a voltage to word-line voltage 110, in other embodiments, individual access transistors 130 and 135 may be selectively coupled and decoupled from word-line voltage 110. Similarly, although access transistors 132 and 137 may be placed into a current-conducting state by way of application of a voltage to word-line voltage 410, in other embodiments, individual access transistors 132 and 137 may be selectively coupled and decoupled from word-line voltage 410.

It may be appreciated that additional groups of MRAM elements may be disposed in parallel with MRAM elements 150 and 155. Additional groupings of MRAM elements may permit backup (and restore) of two or more binary logic values stored within SRAM cell 105, which may correspond to different times at which backup operations of SRAM cell 105 are performed, and claimed subject matter is intended to embrace any number of such additional groupings of MRAM elements.

Figure 5:
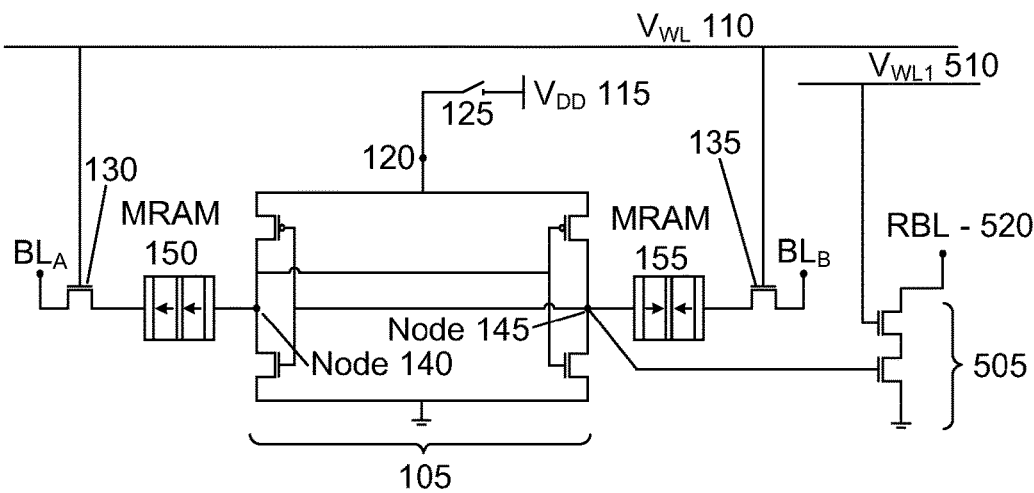
FIG. 5 is a schematic diagram illustrating a circuit for performing a backup operation of binary logic values from an eight-transistor SRAM cell, according to an embodiment

FIG. 5 is a schematic diagram illustrating a circuit 500 for performing a storage operation of binary logic values from an eight-transistor SRAM cell, according to an embodiment. In the circuit of FIG. 5, which illustrates a number of components similar or identical to those of previous figures discussed herein, an additional two-transistor structure (505) is shown as coupled to node 145 of SRAM cell 105. It may be appreciated that utilizing two-transistor structure 505, responsive to word-line voltage 510 ($VWL_1$ 510 in FIG. 5) attaining sufficient voltage, which may be slightly different (e.g., ±about 20.0%) than word-line 110, a binary logic value available at node 145 may be determined via detection of a voltage at read bit-line (RBL) 520. Such a configuration, in which two-transistor structure 505 may operate to provide a read capability that draws a relatively small current from SRAM cell 105, may be implemented utilizing MRAM elements 150, and 155. The arrangement of word-line voltage 510, read bit-line 520, and two-transistor structure 505 may bring about additional advantages, and claimed subject matter is not limited in this respect.

Figure 6:
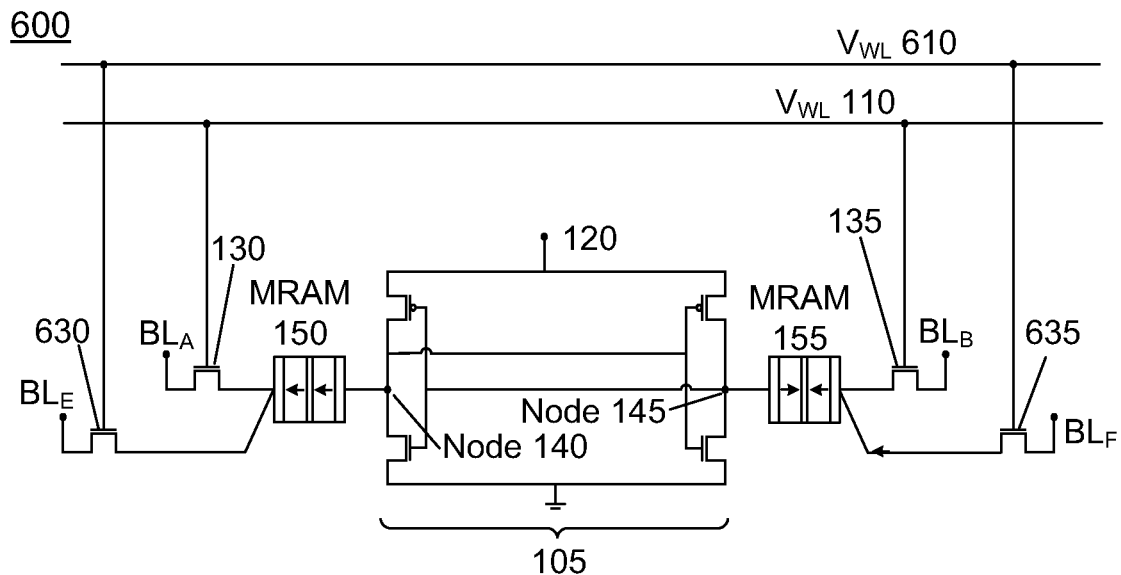
FIGS. 6-7 are schematic diagrams illustrating circuits for performing a backup operation of binary logic values from a SRAM cell, according to an embodiment.

FIG. 6 is a schematic diagram illustrating a circuit 600 for performing backup operation of binary logic values, from a SRAM cell, according to an embodiment. In the circuit of FIG. 6, which illustrates a number of components similar or identical to those of previous figures discussed herein, additional access transistors 630 and 635 are shown as coupled to MRAM element 150 and MRAM element 155. It may be appreciated that responsive to word-line voltage 110 attaining sufficient voltage, access transistors 130 and 135 may be placed into a conductive state, which may permit storage of binary logic values from SRAM cell 105 into MRAM element 150 and 155. In addition, responsive to word-line voltage 610 attaining sufficient voltage, access transistors 630 and 635 may permit direct reading of binary logic values stored within MRAM elements 150 and 155. In the circuit of FIG. 6, direct reading of MRAM element 150 may be initiated by applying an appropriate voltage to bit-line E ($BL_E$ in FIG. 6). Likewise, direct reading of MRAM element 155 may be initiated by applying an appropriate voltage to bit-line F ($BL_F$ in FIG. 6). The configuration FIG. 6 of may permit higher bitcell density when compared with the arrangement of FIG. 4, for example. The arrangement of FIG. 6 may bring about additional advantages, and claimed subject matter is not limited in this respect.

Figure 7:
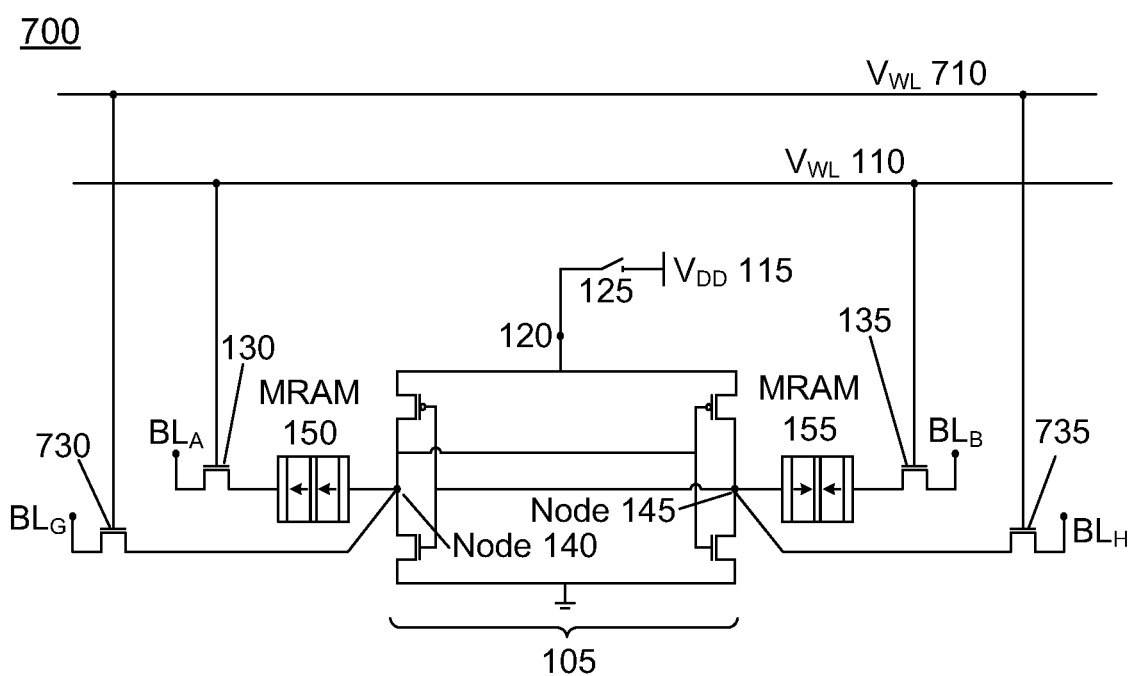

FIG. 7 is a schematic diagram illustrating a circuit 700 for performing a backup operation of binary logic values from a SRAM cell, according to an embodiment. In the circuit of FIG. 7, which illustrates a number of components similar or identical to those of previous figures discussed herein, additional access transistors 730 and 735 are shown as connected directly to node 140 and node 145, without connection to an intervening MRAM element, such as MRAM element 150 or MRAM element 155. It may be appreciated that such an arrangement may permit, at least at particular times, backup of binary logic values from SRAM cell 105, such as by way of applying a voltage equal to approximately one half, or other fraction, of a normal operating value of SRAM cell supply voltage 115 to bit-lines A and B ($BL_A$ and $BL_B$). However, at other times, direct access to SRAM cell 105 may be achieved via application of appropriate voltages to bit-lines G and H ($BL_G$ and $BL_H$ in FIG. 7) while applying an appropriate voltage to word-line 710 ($V_{WL}$710 in FIG. 7). Such a configuration may increase read and write speeds of SRAM cell 105 when accessed through bit-lines that do not comprise MRAM elements in the read path (e.g., bit-lines G ($BL_G$) and H ($BL_H$) of FIG. 7). The arrangement of FIG. 7 may bring about additional advantages, and claimed subject matter is not limited in this respect.

Figure 8:
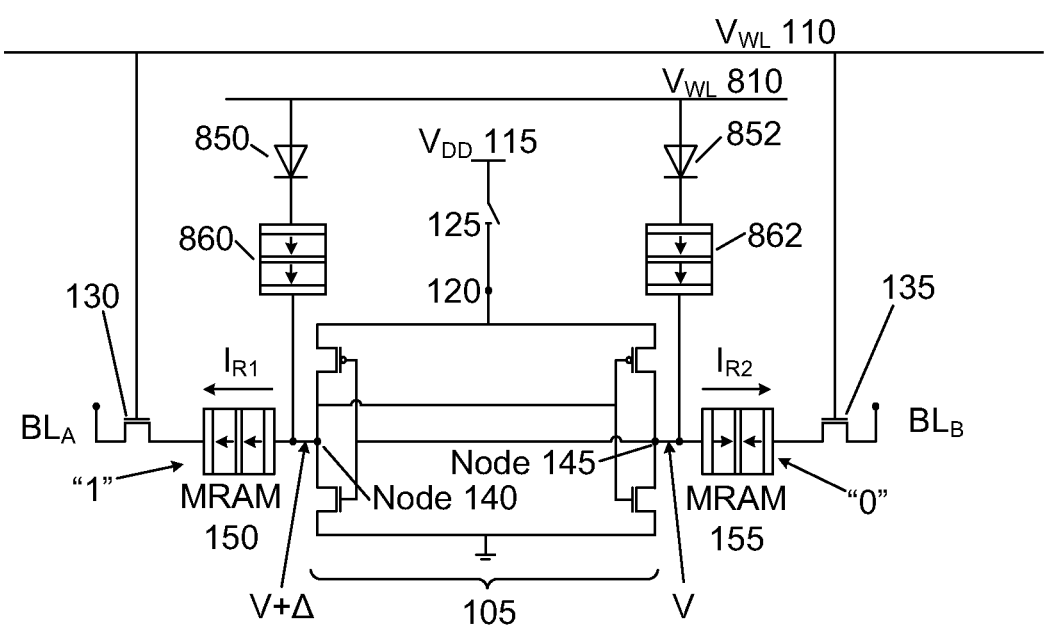
FIG. 8 is a schematic diagram illustrating a circuit for restoring binary logic values from a nonvolatile memory into a volatile memory, according to an embodiment.

FIG. 8 is a schematic diagram illustrating a circuit 800 for restoring binary logic values from a nonvolatile memory into a volatile memory, according to an embodiment. In the circuit of FIG. 8, which illustrates a number of components similar or identical to those of previous figures discussed herein, diode 850 and reference MRAM element 860 are shown as being positioned between word-line voltage 810 and node 140. Likewise, diode 852 and reference MRAM 862 are shown as being positioned between word-line voltage 810 and node 145. In the circuit of FIG. 8, reference MRAM elements 860 and 862 may provide long-term operation in a low-resistance state, so as to operate as a relatively fixed-value resistor.

In the circuit of FIG. 8, backup of binary logic values from SRAM cell 105 may proceed in a manner in accordance with previously discussed approaches. Thus, in FIG. 8, word-line voltage 810 may comprise a reference potential, such as a local ground. Under such conditions, current conduction from nodes 140 and 145 toward word-line voltage 810 may comprise a negligible amount responsive to diodes 850 and 852 operating in a reverse biased mode.

To initiate restoration of binary logic values from MRAM elements 150 and 155 (e.g., binary logic values of "1" and "0") to SRAM cell 105, word-line voltage 110 may be increased to a level sufficient to bring about current conduction through access transistor 130. Additionally, a reference voltage, such as a local ground, may be applied to bit-line A and to bit-line B ($BL_A$ and $BL_B$ in FIG. 8). Further, word-line voltage 810 ($V_{WL}$ 810 in FIG. 8) may be increased from a reference potential. Responsive to MRAM element 150 operating in a low-resistance or "on" state, an appreciable current may conduct from word-line voltage 810 through MRAM element 150 and to bit-line A. It may be appreciated that responsive to reference MRAM element 860 operating as a fixed resistor, the combination of reference MRAM element 860 and MRAM element 150 may operate as a voltage divider network. It may be appreciated that responsive to MRAM element 155 comprising an "off" state resistance, a relatively small current may conduct through MRAM element 155 in the direction of bit-line B ($BL_B$ in FIG. 8).

Thus, in the circuit of FIG. 8, when current conduction through MRAM element 150 is larger than current conduction through MRAM element 155, electrical charges may accumulate at node 140 at a higher rate than a rate at which electrical charges may accumulate at node 145. Accordingly, responsive to coupling of supply voltage 115 ($V_{DD}$) to node 120 via closure of switch 125, voltage at node 140 may quickly attain a value sufficient to bring about a binary logic value of "0" at node 140 and a binary logic value of "1" at node 145. It should be noted that in one embodiment, based, at least in part, on resistance of diodes 850 and 852, reference MRAM elements 860 and 862 may be omitted from embodiment FIG. 8. Accordingly, claimed subject matter is intended to embrace voltage divider networks comprising diodes and/or reference MRAM elements.

Figure 9:
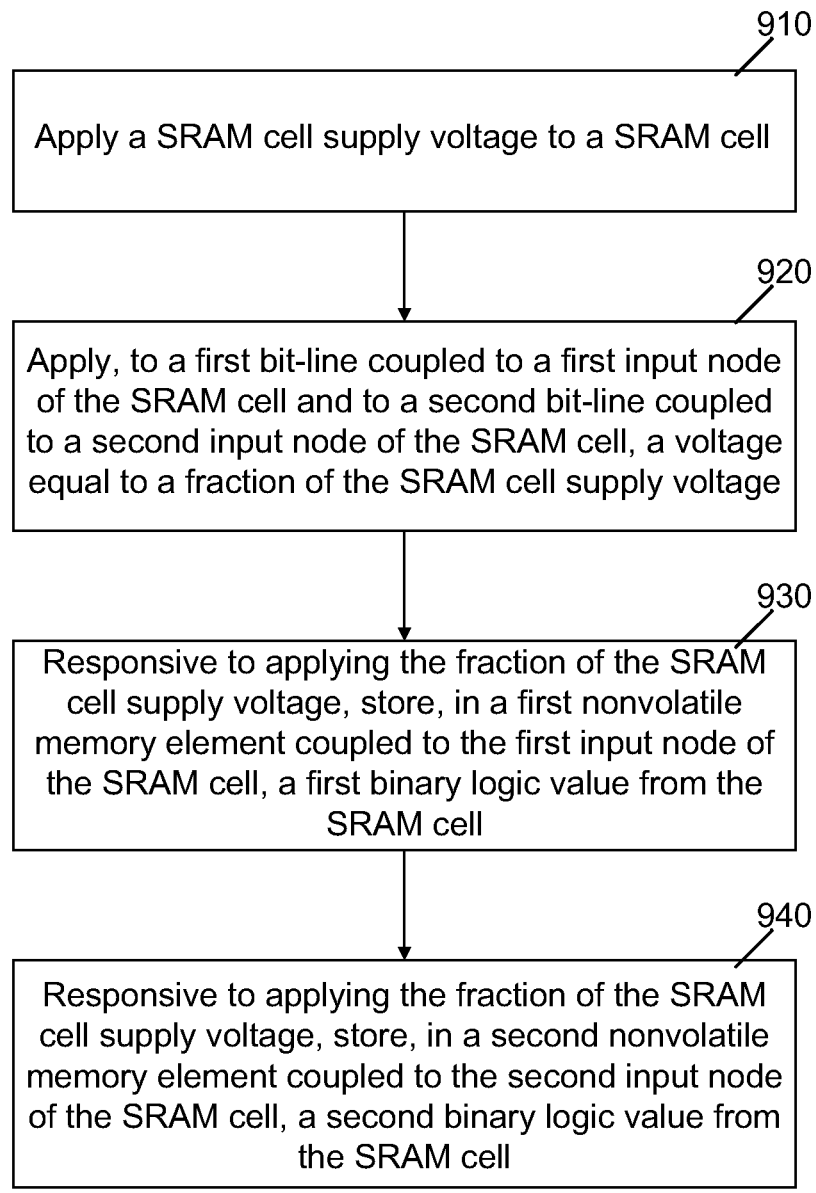
FIG. 9 is a flow chart for a method for performing a backup operation of a SRAM cell, according to an embodiment.

FIG. 9 is a flow chart for a method 900 for performing a backup operation of a SRAM cell, according to an embodiment. Example implementations may include fewer blocks shown in FIG. 9 or blocks occurring in an order different than may be identified, or any combination thereof. The method of FIG. 9 may begin at block 910, which may comprise applying a normal operating voltage to a SRAM cell. In one embodiment, a supply voltage may be applied to a single SRAM cell or may be applied to an array of SRAM cells. In one embodiment, block 910 may comprise switching, such as by way of a power switching MOSFET, to couple a SRAM supply voltage to one or more SRAM cells. In another embodiment, block 910 may comprise boosting or increasing, such as by a value of between about 20.0% and about 80.0% of a SRAM cell voltage so as to reduce likelihood of inadvertent transitioning of a binary logic value accessed at a SRAM cell during a backup operation.

Method 900 may continue, such as at block 920, with applying, to a first bit-line coupled to a first input node of the SRAM cell and to a second bit-line coupled to a second input node of the SRAM cell, a voltage equal to a fraction of the normal operating value of SRAM cell supply voltage. Block 920 may comprise applying a voltage equal to about one-half of the normal operating value of SRAM cell supply voltage or may comprise applying a voltage equal to about 25.0% to about 75.0% of a normal operating value of SRAM cell supply voltage. The method may continue at block 930, wherein, responsive to applying the fraction of the normal operating value of SRAM cell supply voltage, a binary logic value may be stored in a first nonvolatile memory element. In one embodiment, a nonvolatile memory element may comprise a MRAM element having an "on" state resistance of between about 3.0 kΩ and about 10.0 kΩ and having an "off" state resistance of between about 9.0 kΩ and about 30.0 kΩ. The method may continue at block 940, in which, responsive to applying the fraction of the normal operating value of SRAM cell supply voltage, a second nonvolatile memory element coupled to the second input of the SRAM cell may be utilized to store a second binary logic value, such as complement of the binary logic value stored in the first nonvolatile memory element. In particular embodiments, binary logic values may correspond to a logic "1" and a complement of a logic "1," such as a binary "0." It should be noted that blocks 930 and 940 may occur sequentially or may occur simultaneously, and claimed subject matter is not limited in this respect.

Figure 10:
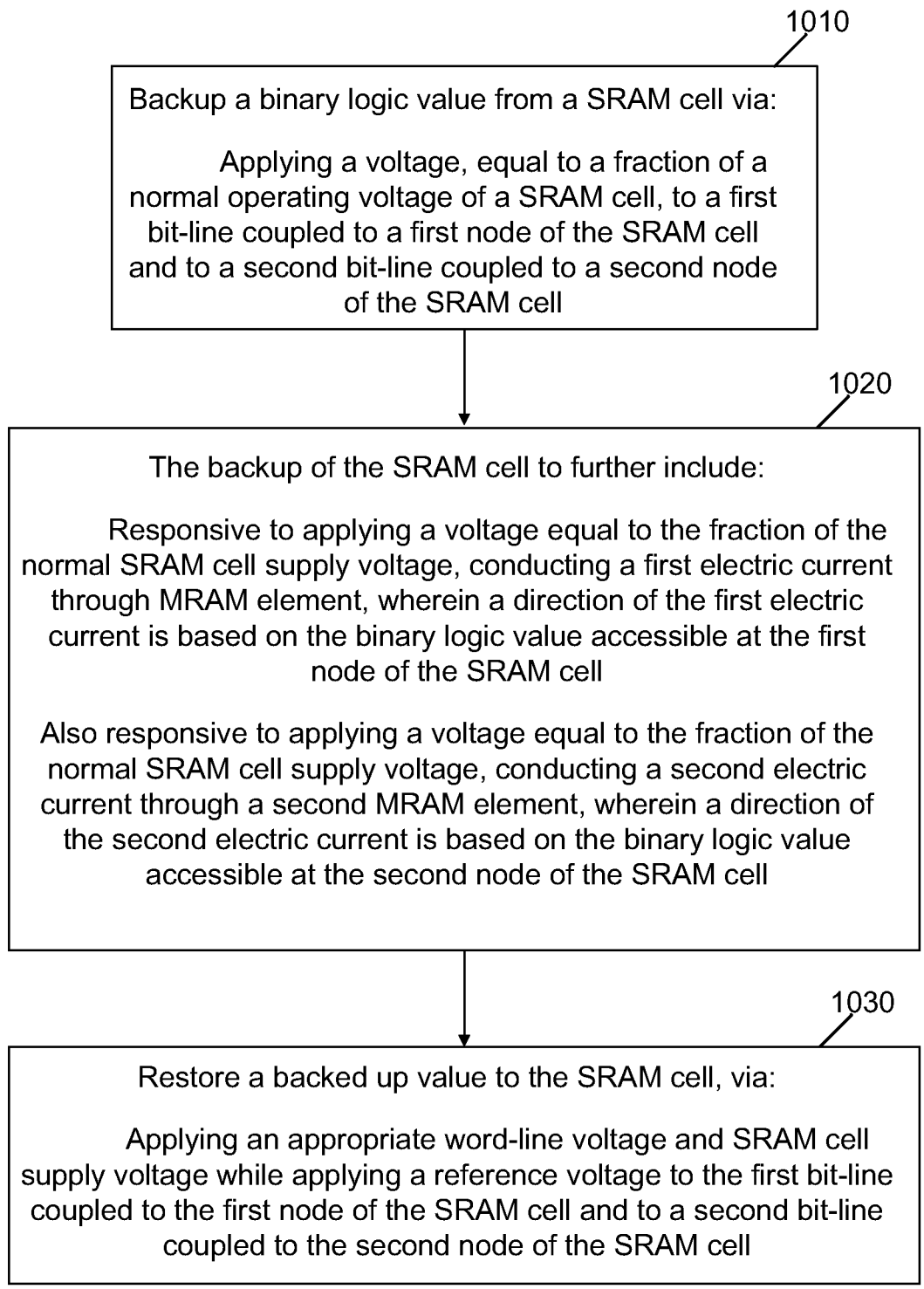
FIG. 10 is a flow chart for a method for performing a backup operation of a SRAM cell followed by a restore operation of the SRAM cell, according to an embodiment.

FIG. 10 is a flow chart for a method 1000 for performing a backup operation of a SRAM cell followed by a restore operation of the SRAM cell, according to an embodiment. Method 1000 may begin at block 1010, which may pertain to operations performed in connection with backing up a plurality of binary logic values from SRAM cell, such as SRAM cell 105 previously discussed herein. A backup operation of a SRAM cell may comprise applying a voltage, equal to a fraction of a normal operating value of a SRAM cell, to a first bit-line coupled to a first node of the SRAM cell and to a second bit-line coupled to a second node of the SRAM cell. In some embodiments, fraction of a normal operating value of a SRAM cell supply voltage may comprise a value of between about 25.0% and about 75.0% of normal operating value of a SRAM cell supply voltage. However, in other embodiments, a fraction of a normal operating value of a SRAM cell supply voltage may comprise other values, and claimed subject matter is not limited in this respect. A first node of a SRAM cell may comprise a node at which a binary logic value may be accessed, such as node 140 of FIG. 1A and node 145, also of FIG. 1A.

Method 1000 may continue at block 1020, which may comprise additional operations performed in connection with performing a backup of a SRAM cell. Block 1020 may comprise, responsive to applying a voltage equal to the fraction of a normal SRAM cell supply voltage, conducting a first electric current through a first MRAM element, wherein a direction of the first electric current is based, at least in part, on a first binary logic value, of the plurality of binary logic values, accessible at the first node of the SRAM cell. In one embodiment, when a binary logic value of "1" is accessible at a node of the SRAM cell, a first electric current conducting through the first and second localized regions of the MRAM element may bring about magnetization vectors parallel to each other. Such orientation of magnetization vectors may bring about a low-resistance state of the first MRAM element. In certain embodiments, block 1020 may additionally comprise, also responsive to applying a voltage equal to the fraction of a normal SRAM cell supply voltage, conducting a second electric current through a second MRAM element, wherein a direction of the second electric current is based, at least in part, on a second binary logic value, of the plurality of binary logic values, accessible at the second node of the SRAM cell. In one embodiment, when a binary logic value of "0" is accessible at a node of the SRAM cell, a second electric current conducting through the first and second localized regions of the MRAM may bring about magnetization vectors antiparallel to each other. Such orientation of magnetization vectors may bring about a high-resistance state of the MRAM element. Thus, the plurality of binary logic values (such as a binary logic value and its complement) may be written to a nonvolatile memory, such as first and second MRAM elements.

Method 1000 may continue at block 1030, which may be performed in connection with restoring the backed up plurality of binary logic values to a SRAM cell. Block 1030 may comprise applying an appropriate word-line voltage and SRAM cell supply voltage while applying a reference voltage to the first bit-line coupled to the first node of the SRAM cell and to a second bit-line coupled to the second node of the SRAM cell. In one embodiment, the application of a reference voltage, such as a local ground or a value that approaches a local ground, a current may conduct through a nonvolatile memory element, such as a MRAM element. As described in reference to FIG. 2, a node of a SRAM cell coupled to a MRAM element placed in an "on" state may accumulate charges at a slower rate than a node of a SRAM cell coupled to a MRAM element placed in an "off" state. Thus, responsive to such charge accumulation, a SRAM cell may attain a logic state in which a binary logic value of "0" may be accessed at a first node while a binary logic value of "1" may be accessed at a second node.

FIG. 11 is a flow chart (1100) for a method for performing a two-phase backup operation of a SRAM cell, according to an embodiment. The method of FIG. 11 may begin at block 1110, which may occur following, or concurrent with, application of a voltage (e.g., a voltage substantially equal to a normal operating value of a SRAM supply voltage or other relatively high voltage signal) to access transistors, such as access transistors 130 and/or 135 of FIG. 1A. A SRAM supply voltage may correspond to supply voltage 115 ($V_{DD}$) also shown in FIG. 1A. In particular embodiments, application of such a voltage may bring about conduction of an electric current from a first bit-line, such as bit-line B ($BL_B$) of FIG. 1A, in the direction of a first MRAM element, such as MRAM element 155, also of FIG. 1A. Accordingly, when current conducted through the first MRAM element comprises a sufficient magnitude, a magnetization vector of a localized ferromagnetic region may switch orientation, so as to be oriented in a direction that is generally antiparallel to another localized ferromagnetic region. Such a condition may correspond to storage of a binary logic "0" in the MRAM element.

At block 1120, which may correspond to a second phase of a two-phase backup operation of a SRAM cell, a voltage substantially equal to a reference voltage, such as a local ground or other relatively low voltage signal, may be applied to bit-lines of the SRAM cell (e.g., $BL_A$ and $BL_B$ of FIG. 1A). Application of such a voltage to a SRAM cell may bring about conduction of electric current from the SRAM cell in the direction of a second MRAM element, such as element 150 of FIG. 1A. Accordingly, responsive to conduction of a second electric current, which may correspond to an electric current such as $IB_1$ of FIG. 1A, a magnetization vector of a localized ferromagnetic region may switch orientation so as to be oriented in a direction parallel to another localized ferromagnetic region. Such a condition may bring about storage of a binary logic "1" in the MRAM element.

Although illustrative embodiments of the invention have been described in detail herein with reference to the accompanying drawings, it is to be understood that the invention is not limited to those precise embodiments, and that various changes, additions and modifications can be effected therein by one skilled in the art without departing from the scope of the invention as defined by the appended claims. For example, various combinations of the features of the dependent claims could be made with the features of the independent claims without departing from the scope of the present invention.

What is claimed is:

1. A method of performing a backup of a static random-access memory (SRAM) cell, comprising:

applying a SRAM cell supply voltage to the SRAM cell;

applying a word-line voltage to first and second access transistors to enable conduction of an electrical current through the first and second access transistors, wherein the first access transistor is configured to electrically couple a first bit-line to a first non-volatile memory element, and wherein the second access transistor is configured to electrically couple a second bit-line to a second non-volatile memory element;

applying, to the first bit-line coupled to a first input node of the SRAM cell and to a second bit-line coupled to the second input node of the SRAM cell, a voltage equal to a fraction of the SRAM cell supply voltage;

responsive to applying the fraction of the SRAM cell supply voltage, storing, in the first nonvolatile memory element coupled between the first access transistor and the first input node of the SRAM cell, a first binary logic value from the SRAM cell; and responsive to applying the fraction of the SRAM cell supply voltage, storing, in the second nonvolatile memory element coupled between the second access transistor and the second input node of the SRAM cell, a second binary logic value from the SRAM cell; and boosting the SRAM cell supply voltage by an amount approximately equal to about 20.0% to about 50.0% of a normal operating value of the SRAM cell supply voltage.

2. The method of claim 1, wherein the first and second nonvolatile memory elements comprise magnetic random-access memory (MRAM).

3. The method of claim 1, wherein the SRAM cell comprises six transistors.

4. The method of claim 1, wherein the fraction of the SRAM cell supply voltage comprises a value of between 25.0% and 75.0% of the value of the SRAM cell supply voltage.

5. The method of claim 1, further comprising restoring the first binary logic value from the first nonvolatile memory element to the SRAM cell, wherein the restoring comprises applying a word-line voltage substantially equal to a SRAM cell supply voltage while applying a reference voltage to the first bit-line and applying the reference voltage to the second bit-line.

6. The method of claim 1, wherein the storing in the first nonvolatile memory element and the storing in the second nonvolatile memory element occur simultaneously.

* * * * *